United States Patent
Liu et al.

(10) Patent No.: US 12,255,389 B2
(45) Date of Patent: Mar. 18, 2025

(54) TRANSPARENT ANTENNA AND DEVICE

(71) Applicant: SHINE OPTOELECTRONICS (KUNSHAN) CO., LTD., Kunshan (CN)

(72) Inventors: Lidong Liu, Kunshan (CN); Yulong Gao, Kunshan (CN); Weiying Bao, Kunshan (CN)

(73) Assignee: SHINE OPTOELECTRONICS (KUNSHAN) CO., LTD., Kunshan (CN)

( * ) Notice: Subject to any disclaimer, the term of this patent is extended or adjusted under 35 U.S.C. 154(b) by 148 days.

(21) Appl. No.: 17/832,989

(22) Filed: Jun. 6, 2022

(65) Prior Publication Data

US 2022/0302578 A1    Sep. 22, 2022

Related U.S. Application Data

(63) Continuation of application No. PCT/CN2020/121937, filed on Oct. 19, 2020.

(51) Int. Cl.
*H01Q 1/42* (2006.01)
*H01Q 1/24* (2006.01)
(Continued)

(52) U.S. Cl.
CPC ............... *H01Q 1/42* (2013.01); *H01Q 1/241* (2013.01); *H01Q 1/243* (2013.01); *H01Q 1/36* (2013.01);
(Continued)

(58) Field of Classification Search
CPC .... H01Q 9/0407; H01Q 1/243; H01Q 1/1271; H01Q 1/1285; H04M 1/0266
See application file for complete search history.

(56) References Cited

U.S. PATENT DOCUMENTS

| | | | |
|---|---|---|---|
| 2009/0051620 A1 | 2/2009 | Ishibashi et al. | |
| 2014/0116754 A1* | 5/2014 | Gao | H05K 1/0213 174/250 |

(Continued)

FOREIGN PATENT DOCUMENTS

| | | |
|---|---|---|
| CN | 104009287 A | 8/2014 |
| CN | 105359066 A | 2/2016 |

(Continued)

OTHER PUBLICATIONS

First Office Action issued in Chinese Patent Application No. 201911281605.1, dated Arp. 19, 2022.
(Continued)

*Primary Examiner* — Dimary S Lopez Cruz
*Assistant Examiner* — Aladdin Abdulbaki
(74) *Attorney, Agent, or Firm* — Westbridge IP LLC

(57) ABSTRACT

Disclosed are a transparent antenna and a device. The transparent antenna includes: a first polymer layer; a first transparent antenna, wherein the first transparent antenna includes an antenna body and a partition region, and one side of the first polymer layer is provided with a grid-like conductive wire to form the antenna body; a second polymer layer, wherein the second polymer layer is provided at one side, where the first transparent antenna is provided, of the first polymer layer; and a second transparent antenna, wherein the second transparent antenna is provided at one side of the second polymer layer away from the first transparent antenna, the second transparent antenna includes an antenna body, and one side of the second polymer layer away from the first transparent antenna is provided with a grid-like conductive wire to form the antenna body.

15 Claims, 7 Drawing Sheets

(51) Int. Cl.
*H01Q 1/36* (2006.01)
*H01Q 1/38* (2006.01)
*H01Q 19/12* (2006.01)
*H01Q 21/28* (2006.01)

(52) U.S. Cl.
CPC .............. *H01Q 1/364* (2013.01); *H01Q 1/38* (2013.01); *H01Q 1/422* (2013.01); *H01Q 19/12* (2013.01); *H01Q 21/28* (2013.01)

(56) References Cited

U.S. PATENT DOCUMENTS

| | | | | |
|---|---|---|---|---|
| 2015/0068787 | A1* | 3/2015 | Chung | ................ H05K 3/1258 174/250 |
| 2015/0116172 | A1 | 4/2015 | Fontecchio et al. | |
| 2019/0013592 | A1 | 1/2019 | West et al. | |

FOREIGN PATENT DOCUMENTS

| | | | | | |
|---|---|---|---|---|---|
| CN | 105425992 | A | | 3/2016 | |
| CN | 105808000 | A | * | 7/2016 | ............... G09F 9/33 |
| CN | 106104915 | A | | 11/2016 | |
| CN | 106708309 | A | | 5/2017 | |
| CN | 107464991 | A | | 12/2017 | |
| CN | 107646095 | A | | 1/2018 | |
| CN | 108539386 | A | | 9/2018 | |
| CN | 109698406 | A | | 4/2019 | |
| CN | 109716585 | A | | 5/2019 | |
| CN | 110392958 | A | | 10/2019 | |
| CN | 110466212 | A | | 11/2019 | |
| CN | 110519953 | A | | 11/2019 | |
| CN | 111342222 | A | | 6/2020 | |
| CN | 210984952 | U | | 7/2020 | |
| CN | 211656591 | U | | 10/2020 | |
| IN | 105470632 | A | | 4/2016 | |
| IN | 107665914 | A | | 2/2018 | |
| KR | 20150002314 | A | * | 6/2013 | ............. H01Q 1/243 |
| KR | 20190071411 | A | | 6/2019 | |
| KR | 102041690 | B1 | * | 11/2019 | ............ H01Q 9/0407 |
| TW | 201303681 | A | | 1/2013 | |
| WO | 2016108408 | A1 | | 7/2016 | |
| WO | 2019093045 | A1 | | 5/2019 | |

OTHER PUBLICATIONS

First Office Action issued in Chinese Patent Application No. 201911315445.8, dated Arp. 19, 2022.
International Search Report issued in PCT Application No. PCT/CN2020/121937, dated Jan. 20, 2021.
International Search Report issued in PCT Application No. PCT/CN2020/121938, dated Jan. 18, 2021.
International Search Report issued in PCT Application No. PCT/CN2020/121940, dated Jan. 19, 2021.
Written Opinion issued in PCT Application No. PCT/CN2020/121937, dated Jan. 20, 2021.
Written Opinion issued in PCT Application No. PCT/CN2020/121938, dated Jan. 18, 2021.
Written Opinion issued in PCT Application No. PCT/CN2020/121940, dated Jan. 19, 2021.

* cited by examiner

TRANSPARENT ANTENNA AND DEVICE

CROSS-REFERENCE TO RELATED APPLICATIONS

This application is a continuation of International Application No. PCT/CN2020/121937, filed on Oct. 19, 2020, which claims priority to Chinese Patent Application 201911240344.9, filed on Dec. 6, 2019, and Chinese Patent Application 201911270707.3, filed on Dec. 12, 2019. All applications are incorporated herein by reference in their entireties.

TECHNICAL FIELD

The present disclosure relates to the technical field of photoelectric products, in particular to a transparent antenna and a device.

BACKGROUND

With the arrival of the age of commercialized 5G, more and more 5G base stations are being built to provide wireless coverage and realize wireless signal transmission between wired communication networks and wireless terminals. The architecture and form of the base stations directly affect how 5G network is deployed. In the current technical standards, the frequency band of 5G is much higher than that of 2G, 3G and 4G networks. At present stage, the 5G network mainly works in the frequency band of 3000-5000 MHz. Because the higher the frequency, the greater the attenuation during the propagation of signals, the density of the base stations of the 5G network should be higher.

Because the attenuation of 5G signal is particularly serious, the requirements for the structure of the antenna and the reception and transmission of the antenna are becoming higher and higher. For example, there may be great impact on the traditional mobile phone antenna with disuse of a metal back cover. The antenna has to be moved outward to enhance the reception and transmission of the signal. Moreover, because the signal is very easy to attenuate, the glass of buildings may need to be used as the base station of the signal, but it cannot affect the light transmission, which requires a new antenna structure to be used on a device and the base station.

SUMMARY

Based on this, it is necessary to provide a transparent antenna and a device to solve the above technical problems.

A technical solution of the present disclosure is disclosed as below.

A transparent antenna includes:
a first polymer layer;
a first transparent antenna, including an antenna body and a partition region, wherein a side of the first polymer layer is provided with a grid-like conductive wire to form the antenna body;
a second polymer layer, provided on a side of the first polymer layer where the first transparent antenna is provided;
a second transparent antenna, provided on a side of the second polymer layer away from the first transparent antenna, wherein the second transparent antenna includes an antenna body and the side of the second polymer layer away from the first transparent antenna is provided with a grid-like conductive wire to form the antenna body.

In an embodiment of the present disclosure, a supporting body is further included, and the supporting body is provided on another side of the first polymer layer.

In an embodiment of the present disclosure, a side of the first polymer layer away from the supporting body is provided with a concave structure, and the concave structure is provided with conductive material to form the first transparent antenna.

In an embodiment of the present disclosure, a side of the second polymer layer away from the supporting body is provided with a concave structure, and the concave structure is provided with conductive material to form the second transparent antenna.

In an embodiment of the present disclosure, a height of the conductive material is less than a depth of the concave structure; or a height of the conductive material is equal to a depth of the concave structure; or a height of the conductive material is greater than a depth of the concave structure.

In an embodiment of the present disclosure, the concave structure includes a bottom surface, two side surfaces and an opening, and black material is provided close to the bottom surface and/or the opening.

In an embodiment of the present disclosure, an included angle between each of the two side surfaces and the bottom surface is not equal to 90 degrees.

In an embodiment of the present disclosure, a projection of the second transparent antenna covers at least 60% of an area of the partition region of the first transparent antenna.

In an embodiment of the present disclosure, in the case where there is an overlapping region between the first transparent antenna and the second transparent antenna, a grid linewidth at the overlapping region is less than a grid linewidth at a non-overlapping region.

A transparent antenna includes:
a supporting body, including a first surface and a second surface provided opposite to the first surface;
a first polymer layer, provided on the first surface of the supporting body;
a first transparent antenna, including an antenna body and a partition region, wherein a side of the first polymer layer away from the supporting body is provided with a concave structure, and the concave structure is provided with conductive material to form the first transparent antenna;
a second polymer layer, provided on the second surface of the supporting body;
a second transparent antenna, including an antenna body, wherein a side of the second polymer layer away from the supporting body is provided with a concave structure, and the concave structure is provided with conductive material to form the second transparent antenna.

In an embodiment of the present disclosure, a projection of the second transparent antenna covers at least 60% of an area of the partition region of the first transparent antenna.

In an embodiment of the present disclosure, in a case where there is an overlapping region between the first transparent antenna and the second transparent antenna, a grid linewidth at the overlapping region is less than a grid linewidth at a non-overlapping region.

A device includes any one of the transparent antennas described above.

In an embodiment of the present disclosure, the device is one of mobile phones, PADs, vehicles, buildings, household appliances, signal base stations and cards requiring signal reception and transmission.

Beneficial effects of the present disclosure: the present disclosure provides a transparent antenna, which can realize the reception and transmission of signals on a transparent material. The positions of two layers of transparent antennas form a mutual "filling" positional relationship, so that the transparent antennas are visually unified and there is no obvious difference in transmittance when people use objects with transparent antennas. Moreover, in order to eliminate obvious visual difference, the antennas can also be provided on different supporting bodies and correspond to the partition regions of different layers respectively.

DETAILED DESCRIPTION OF THE EMBODIMENTS

Figure 1:
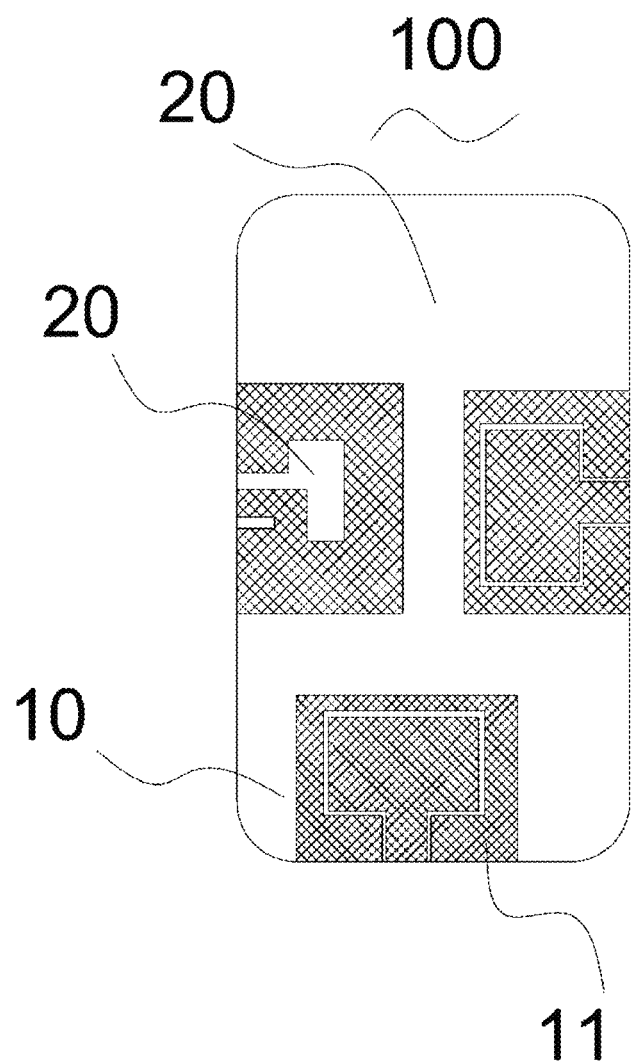
FIG. 1 is a layout diagram of a transparent antenna in the present disclosure.

In order to make objects, technical details and advantages of the present disclosure more apparent, the present disclosure will be further described specifically with reference to the accompanying drawings and embodiments. It should be understood that, the specified embodiments described herein are only used to explain the present disclosure, but not to limit the present disclosure.

In the description of the present disclosure, unless otherwise clearly specified and limited, the terms "first" and "second" are only used for the purpose of description and should not be understood as indicating or implying relative importance; unless otherwise specified or stated, the term "multiple" refers to two or more; and the terms "connection" and "fixed" should be understood in a broad sense. For example, "connection" is a fixed connection, a detachable connection, an integrated connection, or an electrical connection, and is connected directly or indirectly through intermediate media. For those skilled in the art, the specific meanings of the above terms in the present disclosure are understood according to specific situations.

The present disclosure provides a transparent antenna, including: a supporting body or a supporting layer, which is made of polymer material or glass and is mainly used as a support of an antenna; a transparent antenna including an antenna body and a partition region, in which a side of the supporting layer is provided with a grid-like conductive wire to form the antenna body, and the transparent antenna is visually transparent and is actually made of a conductive material, but lines are thin enough for human eyes to distinguish; and a dummy electrode. The partition region is provided with a grid to form the dummy electrode, and the dummy electrode is electrically insulated from the antenna body. Of course, the dummy electrode may also be random line segments. Because the transparent antenna is made of a conductive material, which will affect the transmittance to some extent, in other words, there is a difference in the transmittance between a region with the transparent antenna and a region without the transparent antenna resulting in visual difference of human eyes. Therefore, the dummy electrode is provided in the partition region of the transparent antenna, and the dummy electrode cannot function as an antenna. The material of the dummy electrode may be the same as the material of the transparent antenna, and the material of the dummy electrode may be a conductive material or a non-conductive material. Moreover, in the case where the dummy electrode includes random or regular line segments, the line segments may be overlapped, or all line segments may be independent and not intersect with each other. And of course, the extension lines of the line segments may intersect with each other.

For example, the absolute value of the difference between the transmittance of the antenna body and the transmittance of the dummy electrode is not greater than 20%. Furthermore, the absolute value of the difference between the transmittance of the antenna body and the transmittance of the dummy electrode is not greater than 10%, or the absolute value of the difference between the transmittance of the antenna body and the transmittance of the dummy electrode is not greater than 5% in order to achieve a smaller difference in visual effect.

In an embodiment of the present disclosure, the conductive wire of the transparent antenna is protruded on the supporting layer. Of course, the conductive wire may also be embedded on a side of the supporting layer. In the case where the transparent antenna is an embedded structure, it is equivalent to that a side of the supporting layer is provided with a concave structure, the concave structure forms a grid, and the concave structure is provided with a conductive material to form the conductive wire embedded on the side of the supporting layer. The height of the conductive material is less than the depth of the concave structure; or the height of the conductive material is equal to the depth of the concave structure; or the height of the conductive material is greater than the depth of the concave structure.

For example, the concave structure includes a bottom surface, two side surfaces and an opening, and a black material is provided close to the bottom surface and/or the opening. That is, the bottom of the conductive material in the concave structure is provided with the black material, or the top of the conductive material in the concave structure is provided with the black material, or both the bottom and the top of the conductive material in the concave structure are provided with the black material. Of course, the black material itself may also be conductive. An included angle between each of the two side surfaces and the bottom surface is not equal to 90 degrees. Of course, the included angle between each of the two side surfaces and the bottom surface may also be equal to 90 degrees or less than 90 degrees.

In an embodiment, the grid which forms the dummy electrode includes multiple grid lines, and at least one of the grid lines is disconnected, so that the grid line is disconnected to prevent the dummy electrode from being connected with the antenna body. In this way, the grid of the dummy electrode is disconnected, which further ensures the safety of the antenna body. The grid lines are made of a conductive material and/or a non-conductive material, and the grid lines are embedded in the partition region. Therefore, the grid of the dummy electrode is a convex structure or an embedded structure, and is formed synchronously with the antenna body or is formed by separate processes. The difference between the dummy electrode and the antenna body is that the antenna body plays a role of an antenna, such as receiving and transmitting signals, while the dummy electrode does not play the role of the antenna itself.

Referring to FIG. 1, a transparent antenna array 100 includes a transparent antenna 10, and the transparent antenna 10 includes an antenna body 11 and a partition region 20. It is illustrated in FIG. 1 that a single transparent antenna 10 itself includes an antenna body 11 and a partition region 20, and there is also a partition region 20 between multiple transparent antennas 10. In this way, the single transparent antenna 10 includes the antenna body 11 and the partition region 20, and the partition region 20 is provided with a dummy electrode. The dummy electrode includes a grid or line segments, and the dummy electrode is electrically insulated from the antenna body. There may also be a partition region 20 between multiple transparent antennas 10, the partition region 20 may also be provided with a dummy electrode, and the dummy electrode includes a grid or line segments. Moreover, the grid or line segments composing the dummy electrode may be connected, or the grid lines composing the grid are disconnected. In the case where the line segments are used to compose the dummy electrode, the line segments are intersect or not intersect with each other.

Figure 2:
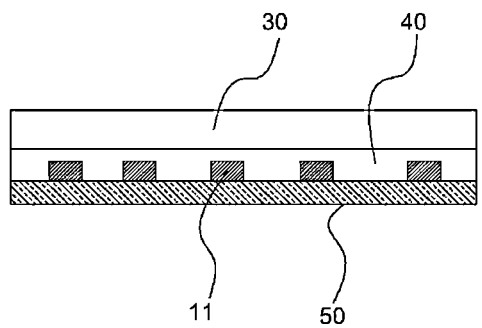
FIG. 2 is a cross-sectional structural diagram of a transparent antenna in the present disclosure.

Referring to FIG. 2, a transparent antenna is disclosed, and the transparent antenna includes a supporting body 30, a polymer layer 40, an antenna body 11 and a shielding layer 50. The supporting body 30 is made of glass or PMMC, or is made of PET, PC, PE or composite board. A side of the supporting body 30 is provided with the polymer layer 40. The side of the polymer layer 40 away from the supporting body 30 is provided with a concave structure, and the concave structure is provided with a conductive material to form the antenna body 11. Of course, the antenna body 11 may also be a convex structure (not shown in the figure). The side of the polymer layer 40 provided with the antenna body 11 is further provided with the shielding layer 50. The shielding layer 50 is made of colored ink or other colored shielding materials for shielding. Of course, the transparent antenna applying the structure shown in FIG. 2 may also be provided with a dummy electrode (not shown in the figure). The structure in FIG. 2 may be used as cover plates of some electronic devices or as cover plates of some household appliances in practical applications, for example, the structure is used in mobile phones, PADs, watches, televisions and other devices that need antennas.

Figure 3:
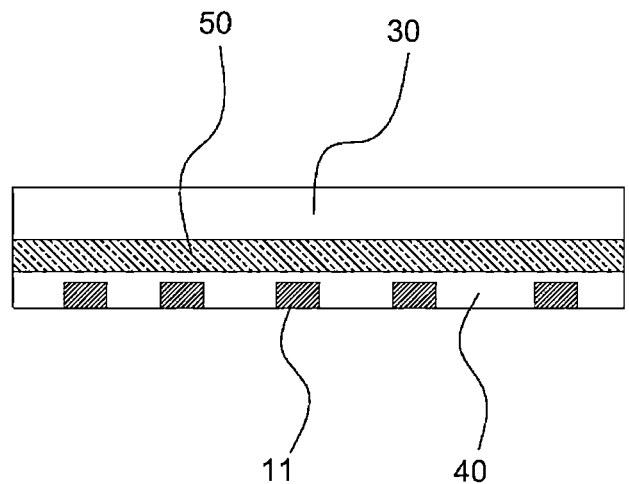
FIG. 3 is a structural diagram of a transparent antenna in the present disclosure.

Referring to FIG. 3, another product structure of a transparent antenna is disclosed, and the transparent antenna includes a supporting body 30, a polymer layer 40, an antenna body 11 and a shielding layer 50. The supporting body 30 is made of glass, PMMC, PET, PC, PE or composite board. A side of the supporting body 30 is provided with the shielding layer 50, which is made of colored ink or other colored shielding materials for shielding. The side of the shielding layer 50 away from the supporting body 30 is provided with the polymer layer 40, and the side of the polymer layer 40 away from the shielding layer 50 is provided with a concave structure. The concave structure is provided with a conductive material to form the antenna body 11. Of course, the antenna body 11 may also be a convex structure (not shown in the figure). Of course, the transparent antenna applying the structure in FIG. 3 may also be provided with a dummy electrode (not shown in the figure). Moreover, if the supporting body 30 is an using surface (or called as a user surface), because the antenna body 11 is shielded by the shielding layer 50 and the antenna body 11 cannot be seen in user vision, the antenna body 11 may also be non-transparent, or the transmittance of the transparent antenna does not need to be particularly high, for example, the transmittance is 20%, 40%, or 70%. Of course, the transmittance of the transparent antenna may be similar or the same as the transmittance of the transparent antenna towards the user surface, for example, greater than 85%, or greater than 90%, or even higher, greater than 92%. The product structure in FIG. 3 may also be applied to cover plates of some electronic devices, as well as cover plates of some household appliances, or used in vehicles and buildings, for example, the structure is used in mobile phones, PADs, watches, televisions and other devices that need antennas.

Figure 4:
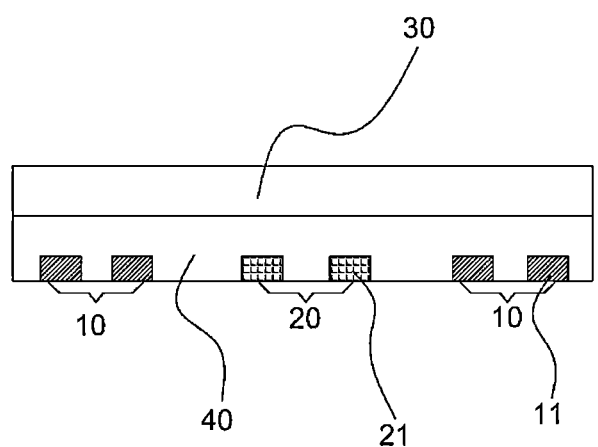
FIG. 4 is another cross-sectional structural diagram of a transparent antenna in the present disclosure.

Referring to FIG. 4, another embodiment of a transparent antenna is disclosed. The transparent antenna includes a supporting body 30, a polymer layer 40, a transparent antenna 10 and a dummy electrode 20. The polymer layer 40 is provided on a side of the supporting body 30, the side of the polymer layer 40 away from the supporting body 30 is provided with a concave structure, and the concave structure is provided with a conductive material to form the transparent antenna 10 and the dummy electrode 20. The transparent antenna 10 includes an antenna body 11 and a partition region, and the antenna body 11 includes a grid-like conductive wire. The dummy electrode is provided in the partition region and includes a gird or line segments, and the grid includes multiple grid lines 21. The absolute value of the difference between the transmittance of the antenna body and the transmittance of the dummy electrode is not greater than 20%. For better visual effect, the absolute value of the difference between the transmittance of the antenna body and the transmittance of the dummy electrode is not greater than 10%, or is not greater than 5%.

The transparent antenna 10 and the dummy electrode 20 shown in FIG. 4 are both concave structures. The antenna body 11 of the transparent antenna 10 may be embedded in the polymer layer 40, in which the embedding refers to that the conductive material is provided in the concave structure with the thickness of the conductive material being less than the depth of the concave structure, or being equal to the depth of the concave structure or being higher than the depth of the concave structure. The antenna body 11 of the transparent antenna 10 may also be a convex structure. Of course, the grid lines 21 of the dummy electrode 20 may also be a convex structure. And the dummy electrode may also include line segments, and the line segments may be independent and not intersect with each other, or may be overlapped with each other. In the case where the dummy electrode includes a grid, the grid lines composing the dummy electrode 20 are electrically disconnected, so that the grid lines of the dummy electrode are not conductive.

The transparent antenna disclosed in FIG. 4 can be used on electrical devices, including electronic devices with display function, such as mobile phones, PADs, etc. The transparent antenna may be directly formed in a display region in front of a mobile phone, in this case, the supporting body 30 is made of glass, and the transparent antenna 10 is provided below the glass, so that the display region of the mobile phone can also be used to provide the receiving and transmitting terminals of the antenna, without affecting the normal use and viewing of the mobile phone. Of course, the structure may also be applied on a back cover of the mobile phone, and is provided under the glass or composite plate of the back cover of the mobile phone, which does not affect the appearance of the back cover of the mobile phone. In addition, the transparent antenna may also be applied on windows of vehicles. With the commercialization of 5G, the number of signal base stations increases sharply, and 5G signal is easy to be shielded. Therefore, the transparent antenna can be formed on the windows (such as glass, PMMA or other transparent materials) of vehicles, such as the glass of the car window, the glass of the high-speed rail, etc., which can well ensure the reception and transmission of the signal. The transparent antenna may also be used on glass of buildings or components with transmittance. Moreover, the transparent antenna may be directly formed on glass, or may be bonded to the glass or transparent medium through bonding.

Figure 5:
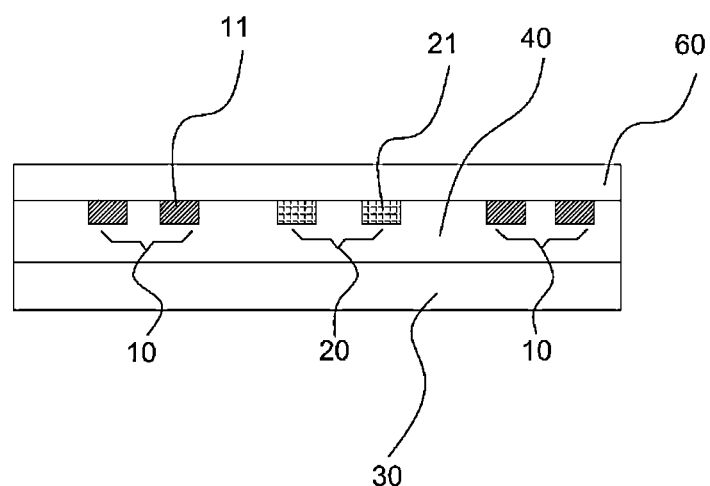
FIG. 5 is another structural diagram of a transparent antenna in the present disclosure.

Referring to FIG. 5, another structure of a transparent antenna is disclosed. The transparent antenna includes a supporting body 30, a polymer layer 40, a protective layer 60, a transparent antenna 10 and a dummy electrode 20. The polymer layer 40 is provided on a side of the supporting body 30, the side of the polymer layer 40 away from the supporting body 30 is provided with a concave structure, and the concave structure is provided with a conductive material to form the transparent antenna 10 and the dummy electrode 20. The transparent antenna 10 includes an antenna body 11 and a partition region. The antenna body 11 includes a grid-like conductive wire, and the dummy electrode 20 is provided in the partition region. The dummy electrode includes a grid or line segments, and the grid includes grid lines 21. And the absolute value of the difference between the transmittance of the antenna body and the transmittance of the dummy electrode is not greater than 20%. For better visual effect, the absolute value of the difference between the transmittance of the antenna body and the transmittance of the dummy electrode is not greater than 10%, or not greater than 5%. The side of the transparent antenna 10 and the dummy electrode 20 away from the supporting body 30 is provided with the protective layer 60. The protective layer 60 may be made of a material with a hardness not less than 2H. Of course, the protective layer 60 may also be made of a material like transparent leather, so the protective layer 60 may be made of a UV material, a PU material, a TPU material, etc.

Referring to FIG. 5, in the transparent antenna structure of FIG. 5, the transparent antenna 10 and the dummy electrode 20 are both directly provided on the user surface, and the protective layer needs to be provided on the surface of the transparent antenna to protect the transparent antenna structure from being damaged. Moreover, the structure has no location limitation. Taking a mobile phone as an example, the transparent antenna of this structure is provided under a screen cover, and is also provided above the screen cover, or is provided under glass of the back cover of the mobile phone, or is provided directly outside the back cover of the mobile phone. The transparent antenna structure shown in FIG. 5 is very advantageous for use in car windows, buildings, etc., and can be well used as an antenna of a base station or as an antenna for communication.

Figure 6:
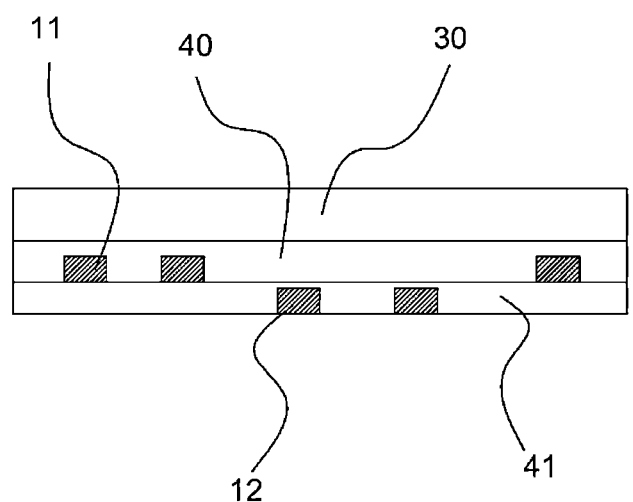
FIG. 6 is yet another cross-sectional structural diagram of a transparent antenna in the present disclosure.
Figure 13:
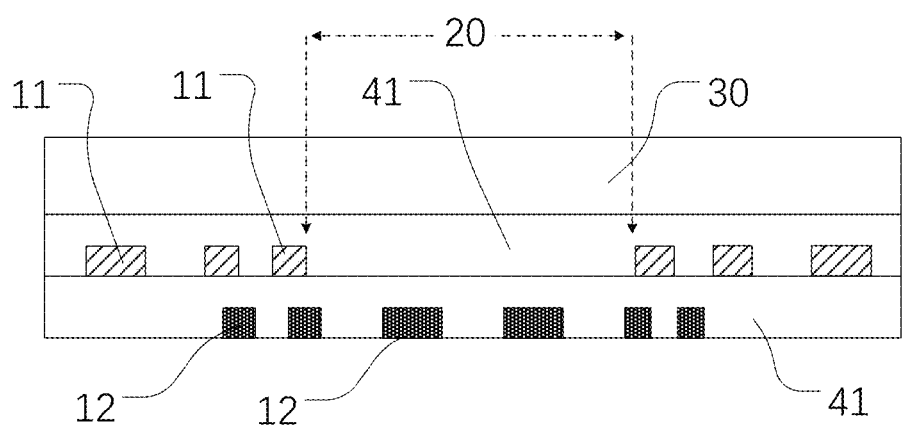
FIG. 13 is a cross-sectional diagram of a transparent antenna in the present disclosure.

Referring to FIG. 6 and FIG. 13, another embodiment of a transparent antenna is disclosed. The transparent antenna includes a supporting body 30, a first polymer layer 40 (the "first" here is only for convenience of description, and can also be referred to as the polymer layer 40), a second polymer layer 41, a first transparent antenna and a second transparent antenna. The first polymer layer 40 is provided on a side of the supporting body 30, and the side of the first polymer layer 40 away from the supporting body 30 is provided with a concave structure. The concave structure is provided with a conductive material to form the first transparent antenna, the first transparent antenna includes an antenna body 11 (can also be referred to as a "first antenna body") and a partition region, and the antenna body 11 includes a grid-like conductive wire. The second polymer layer 41 is provided on a side of the first polymer layer 41, and the side of the second polymer layer 41 away from the first polymer layer 40 is provided with a concave structure. The concave structure is provided with a conductive material to form the second transparent antenna, the second transparent antenna includes an antenna body 12 (can also be referred to as a "second antenna body"), and the antenna body 12 includes a grid conductive wire. And the projection of the second transparent antenna covers at least 60% of the area of the partition region of the first transparent antenna, or covers 80% of the area of the partition region of the first transparent antenna, or covers more than 95% of the area of the partition region of the first transparent antenna in order to achieve better visual effect. The partition region described here is a partition region of a single transparent antenna, or a partition region between two transparent antennas. In the present embodiment, the first transparent antenna and the second transparent antenna cooperate with each other to "fill" their respective partition regions, in which the partition regions may be completely "filled" or partially "filled", in order to reduce visual difference caused by difference in transmittance. Of course, as shown in FIG. 13, in the case where there is an overlapping region between the first transparent antenna and the second transparent antenna, in order to ensure a similar transmittance, the grid linewidth at the overlapping region is less than the grid linewidth at a non-overlapping region, so as to ensure that the transmittance at the overlapping region is similar to the transmittance at the non-overlapping region. For example, the grid linewidth at the overlapping region of the antenna body 11 of the first transparent antenna is 3 microns, while the grid linewidth at the non-overlapping region of the antenna body 11 is 5 microns, so that the absolute value of the difference between the grid linewidth at the overlapping region and the grid linewidth at the non-overlapping region is not less than 0.5 microns. Of course, the same is true for the second transparent antenna.

Figure 7:
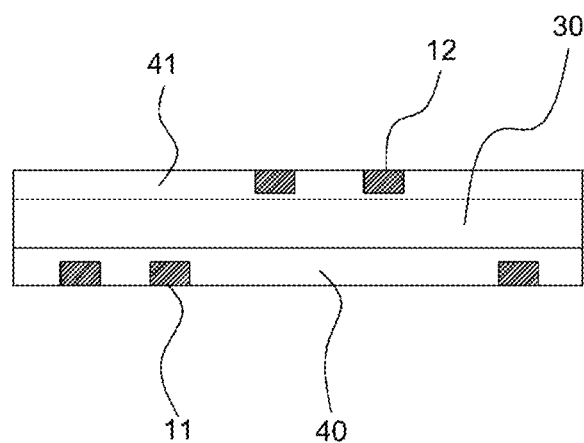
FIG. 7 is yet another structural diagram of a transparent antenna in the present disclosure.

Referring to FIG. 7, another structure of a transparent antenna is disclosed, the structure is obtained from a change of the structure shown in FIG. 6, in which the first polymer layer 40 and the second polymer layer 41 are respectively provided on both sides of the supporting body 30. Therefore, the first transparent antenna and the second transparent antenna are located on both sides of the supporting body 30, and the other structures are similar to the structure shown in FIG. 6.

The structures of the transparent antennas shown in FIG. 6 and FIG. 7 are both applicable for mobile phones, PADs, household appliances, buildings and vehicles.

Figure 8:
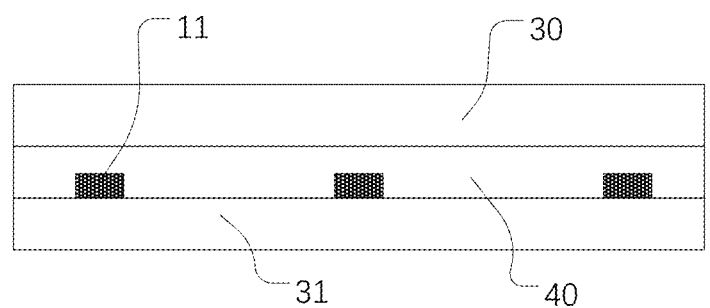
FIG. 8 is still another cross-sectional structural diagram of a transparent antenna in the present disclosure.

Referring to FIG. 8, another embodiment discloses a transparent antenna. The transparent antenna includes a supporting body 30, a polymer layer 40 and a covering layer 31. The polymer layer 40 is provided on a side of the supporting body 30, a concave structure is provided on the side of the polymer layer 40 away from the supporting body 30, and the concave structure is provided with a conductive material to form the transparent antenna. The transparent antenna includes an antenna body 11, and the antenna body 11 includes a grid-like conductive wire. The covering layer 31 is provided on the side of the polymer layer 40 away from the supporting body 30. Both the covering layer 31 and the supporting body 30 are made of glass, or the material of the covering layer is different from the material of the supporting body, so that the transparent antenna is located between the covering layer and the supporting body. For example, there are many double-layer glass in architectural glass allowing the transparent glass structure to be provided between two layers of glass, and there are many structures with an interlayer in window glass of vehicles.

Figure 9:
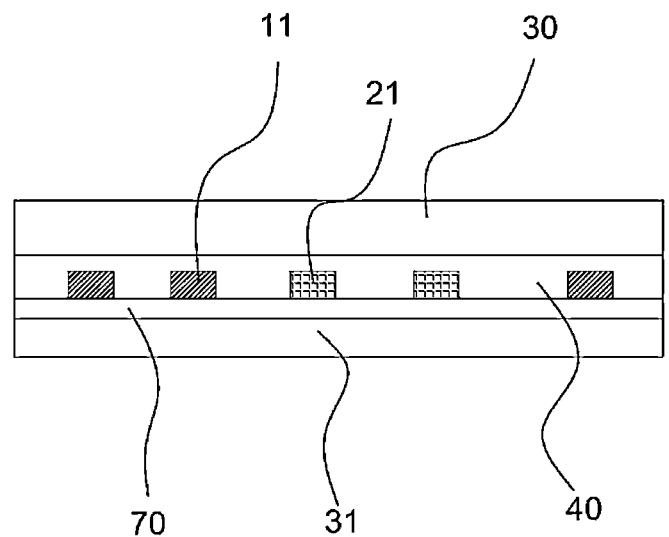
FIG. 9 is still another structural diagram of a transparent antenna in the present disclosure.

Referring to FIG. 9, another structure of a transparent antenna is disclosed. The transparent antenna includes a supporting body 30, a polymer layer 40, an optical interlayer 70 and a covering layer 31. The polymer layer 40 is provided on a side of the supporting body 30. The side of the polymer layer 40 away from the supporting body 30 is provided with a concave structure, and the concave structure is provided with a conductive material to form a transparent antenna and a dummy electrode. The transparent antenna includes an antenna body 11 and a partition region, and the antenna body 11 includes a grid-like conductive wire. The dummy electrode is provided in the partition region and includes a grid or line segments, and the grid includes grid lines 21. The absolute value of the difference between the transmittance of the antenna body and the transmittance of the dummy electrode is not greater than 20%. For better visual effect, the absolute value of the difference between the transmittance of the antenna body and the transmittance of the dummy electrode is not greater than 10%, or not greater than 5%. Both the covering layer 31 and the supporting body 30 are made of glass, or the material of the covering layer is different from the material of the supporting body, so that the transparent antenna is located between the covering layer and the supporting body. The structures of the dummy electrode and the transparent antenna here are the same as that described above. The optical interlayer 70 is located between the polymer layer 40 and the covering layer 31. The optical interlayer 70 may be a vacuum layer. Of course, the optical interlayer 70 may also be made of an optical glue, so that the covering layer 31 can be bonded with the polymer layer 40, which is well applied to transparent materials with an interlayer or transparent materials with a vacuum interlayer.

Figure 10:
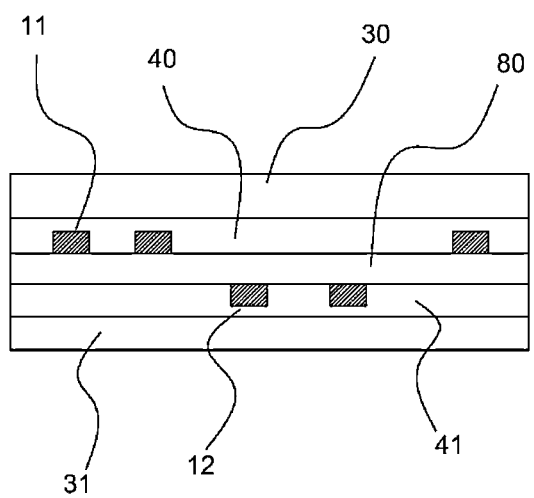
FIG. 10 is still another structural diagram of a transparent antenna in the present disclosure.

Referring to FIG. 10, a structure of another transparent antenna is disclosed. The transparent antenna includes a supporting body 30, a first polymer layer 40, an adhesive layer 80, a second polymer layer 41 and a covering layer 31. The first polymer layer 40 is provided on a side of the supporting body 30, and the side of the first polymer layer 40 away from the supporting body 30 is provided with a concave structure, and the concave structure is provided with a conductive material to form a first transparent antenna. The first transparent antenna includes a first antenna body 11 and a partition region, and the first antenna body 11 includes a grid-like conductive wire. The second polymer layer 41 is provided on a side of the covering layer 31, the side of the second polymer layer 41 away from the covering layer 31 is provided with a concave structure, and the concave structure is provided with a conductive material to form a second transparent antenna. The second transparent antenna includes a second antenna body 12 and a partition region, and the second antenna body 12 includes a grid-like conductive wire. And the covering layer 31 here plays a role of a supporting body, only names being with different. The projection of the second transparent antenna covers at least 60% of the area of the partition region of the first transparent antenna, of course, or covers 80% of the area of the partition region of the first transparent antenna, or in order to achieve better visual effect, covers more than 95% of the area of the partition region of the first transparent antenna. The partition region described here is a partition region of a single transparent antenna, or a partition region between two transparent antennas. In the present embodiment, the first transparent antenna and the second transparent antenna cooperate with each other to "fill" their respective partition regions, in which the partition regions may be completely "filled" or partially "filled", in order to reduce visual difference caused by difference in transmittance. Of course, in the case where there is an overlapping region between the first transparent antenna and the second transparent antenna, in order to ensure a similar transmittance, the grid linewidth at the overlapping region is less than the grid linewidth at a non-overlapping region, so as to ensure that the transmittance at the overlapping region is similar to the transmittance at the non-overlapping region. For example, the grid linewidth at the overlapping region of the antenna body 11 of the first transparent antenna is 3 microns, while the grid linewidth at the non-overlapping region of the antenna body 11 is 5 microns, so that the absolute value of the difference between the grid linewidth at the overlapping region and the grid linewidth at the non-overlapping region is not less than 0.5 microns. Of course, the same is true for the second transparent antenna. The first transparent antenna and the second transparent antenna are connected with each other through the adhesive layer 80, for example, the first transparent antenna and the second transparent antenna are bonded to each other "face to face" (as shown in FIG. 10). Of course, the first transparent antenna is bonded to the side of the covering layer 31 away from the second transparent antenna through the adhesive layer 80 (not shown in the figure), so this structure can also be used in electronic devices, household appliances, buildings and vehicles.

Figure 11:
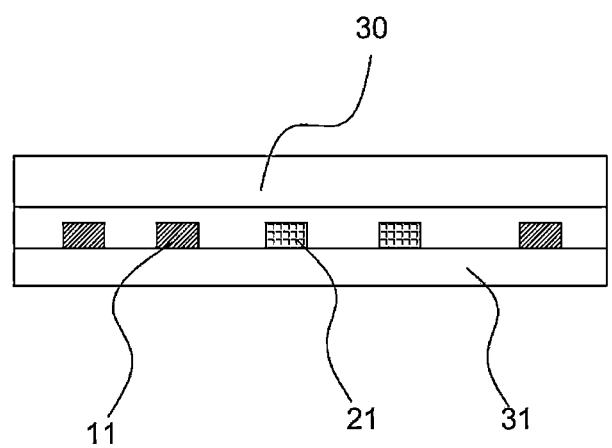
FIG. 11 is still another structural diagram of a transparent antenna in the present disclosure.

Referring to FIG. 11, another transparent antenna structure is disclosed, and the transparent antenna structure is similar to the transparent antenna structure in FIG. 8. The difference is that the transparent antenna structure here includes a transparent antenna and a dummy electrode, and the transparent antenna includes an antenna body 11 and a partition region. The antenna body 11 includes a grid-like conductive wire, and the dummy electrode is provided in the partition region. The dummy electrode includes a grid or line segments, and the grid includes grid lines 21. Furthermore, the absolute value of the difference between the transmittance of the antenna body and the transmittance of the dummy electrode is not greater than 20%. Furthermore, for better visual effect, the absolute value of the difference between the transmittance of the antenna body and the transmittance of the dummy electrode is not greater than 10%, or not greater than 5%.

The transparent antenna described above is applied to fields including mobile phones, PADs, household appliances, cards requiring signal reception and transmission, windows or transparent regions of buildings, vehicles, and other electronic devices, such as watches. With the increasing number of 5G base stations, the transparent antenna can also be used as an antenna of the 5G base station. Although the present disclosure discloses a transparent antenna, the transparent antenna does not necessarily need to be used in devices that need to be transparent and may also be used in devices that do not need to be transparent.

Figure 12:
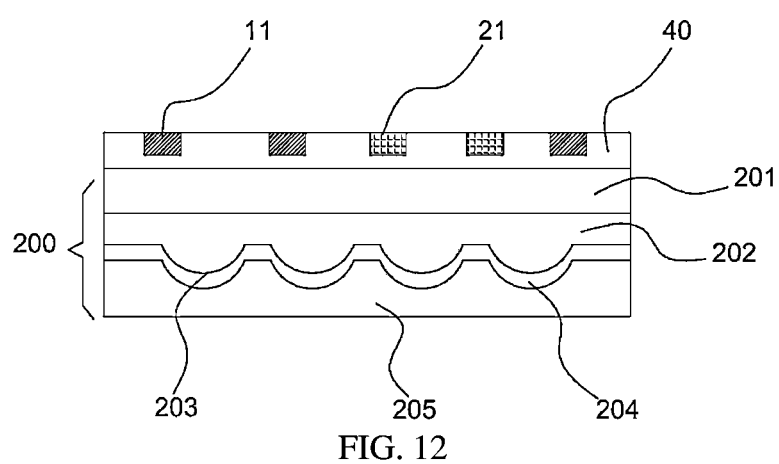
FIG. 12 is a cross-sectional diagram of a transparent antenna in the present disclosure.

Referring to FIG. 12, another embodiment discloses a cover plate module. The cover plate module includes: a supporting layer 201 including a first surface and a second surface provided opposite to the first surface, in which the supporting layer 201 may be made of PET, glass, PU, TPU, PE, PMMA and other materials that play a supporting role; a transparent antenna including an antenna body 11 and a partition region, in which the first surface of the supporting layer 201 is provided with a grid-like conductive wire to form the antenna body 11; a dummy electrode, including a grid or line segments, in which the grid includes grid lines 21 and the absolute value of the difference between the transmittance of the antenna body 11 and the transmittance of the dummy electrode is not greater than 20%, for better visual effect, the absolute value of the difference between the transmittance of antenna body 11 and the transmittance of the dummy electrode is not greater than 10%, or not greater than 5%, and the dummy electrode is electrically insulated from the antenna body 11; and a decorative layer 200, provided on the second surface of the supporting layer 201, in which the decorative layer 200 can reflect an effect of gradual light and shadow, or an effect of light and shadow with a normal straight line or a curve, or an effect of light and shadow forming an image. The decorative layer 200 includes: a micro-nano structural layer 202, provided on the second surface of the supporting layer 201, in which the side of the micro-nano structural layer 202 away from the supporting layer 201 is provided with a micro-nano structure 203 which may be a linear cylindrical mirror, a curved cylindrical mirror, a line segment structure (in shape of a small short line), a microlens, a concave structure, a CD pattern, a trihedral cone, a tetrahedral cone and other structures, and the material of the micro-nano structural layer 202 may be a colored polymer, such as a colored UV-curable resin, of course or a heat-curable colored glue; a reflective layer 204, provided on the side of the micro-nano structural layer 202 away from the supporting layer 201, in which the reflective layer 204 plays a role of reflection or color displaying, and in fact, a reflective layer with a certain transmittance is also provided on the first surface of the supporting layer 201, that is, between the polymer layer 40 and the supporting layer 201, and/or, a reflective layer with a certain transmittance is also provided between the micro-nano structural layer 202 and the supporting layer 201; and a coloring layer 205, provided on the side of the reflecting layer 204 away from the micro-nano structural layer 202, in which the coloring layer 205 is mainly used to shield light, and can also play a role of color displaying together with the reflecting layer 204.

In an embodiment, the decorative layer 200 includes at least two layers of the micro-nano structural layer 202, which may achieve a richer visual effect, so that the cover plate module can have both decorative effects and functions of signal transmission and reception.

In order to make the above purpose, features and advantages of the present disclosure more obvious and easier to understand, the specific embodiments of the present disclosure are described in detail above with reference to the accompanying drawings. Many specific details are illustrated in the above description to facilitate a full understanding of the present disclosure. However, the present disclosure may be implemented in many other ways different from those described above. Those skilled in the art can make similar improvements without violating the connotation of the disclosure. Therefore, the present disclosure is not limited by the specific embodiments disclosed above. Moreover, the technical features of the above embodiments can be combined arbitrarily. In order to make the description concise, all possible combinations of the technical features in the above embodiments are not described. However, as long as there is no contradiction in the combination of these technical features, they should fall in the scope recorded in this specification.

The above embodiments only disclose several embodiments of the present disclosure, and the description is more specific and detailed, but it cannot be understood as a limit of the scope of the patent of the present disclosure. It should be noted that for those skilled in the art, several modifications and improvements can be made without departing from the concept of the present disclosure, which belong to the protection scope of the disclosure. Therefore, the protection scope of the patent of this disclosure should be subject to the appended claims.

What is claimed is:

1. A transparent antenna, comprising: a first polymer layer; a first transparent antenna, comprising an antenna body and a partition region, wherein a side of the first polymer layer is provided with a grid-like conductive wire to form the antenna body; a second polymer layer, provided on a side of the first polymer layer where the first transparent antenna is provided; a second transparent antenna, provided on a side of the second polymer layer away from the first transparent antenna, wherein the second transparent antenna comprises an antenna body, the antenna body of the second transparent antenna covers at least a part of the partition region of the first transparent antenna, and the side of the second polymer layer away from the first transparent antenna is provided with a grid-like conductive wire to form the antenna body; and an adhesive layer, located between the first polymer layer and the second polymer layer; wherein a grid linewidth at an overlapping region is less than a grid linewidth at a non-overlapping region between the first transparent antenna and the second transparent antenna.

2. The transparent antenna of claim 1, further comprising a supporting body, wherein the supporting body is provided on another side of the first polymer layer.

3. The transparent antenna of claim 2, wherein a side of the first polymer layer away from the supporting body is provided with a concave structure, and the concave structure is provided with conductive material to form the first transparent antenna.

4. The transparent antenna of claim 3, wherein a height of the conductive material is less than a depth of the concave structure; or a height of the conductive material is equal to a depth of the concave structure; or a height of the conductive material is greater than a depth of the concave structure.

5. The transparent antenna of claim 2, wherein a side of the second polymer layer away from the supporting body is provided with a concave structure, and the concave structure is provided with conductive material to form the second transparent antenna.

6. The transparent antenna of claim 5, wherein a height of the conductive material is less than a depth of the concave structure; or a height of the conductive material is equal to a depth of the concave structure; or a height of the conductive material is greater than a depth of the concave structure.

7. The transparent antenna of claim 3, wherein the concave structure comprises a bottom surface, two side surfaces and an opening, and a black material is provided close to the bottom surface and/or the opening.

8. The transparent antenna of claim 7, wherein an included angle between each of the two side surfaces and the bottom surface is not equal to 90 degrees.

9. The transparent antenna of claim 5, wherein the concave structure comprises a bottom surface, two side surfaces and an opening, and a black material is provided close to the bottom surface and/or the opening.

10. The transparent antenna of claim 9, wherein an included angle between each of the two side surfaces and the bottom surface is not equal to 90 degrees.

11. The transparent antenna of claim 1, wherein a projection of the second transparent antenna covers at least 60% of an area of the partition region of the first transparent antenna.

12. A device, comprising the transparent antenna according to claim 1.

13. The device of claim 12, wherein the device is one of mobile phones, PADs, vehicles, buildings, household appliances, signal base stations and cards requiring signal reception and transmission.

14. A transparent antenna, comprising: a supporting body, comprising a first surface and a second surface provided opposite to the first surface; a first polymer layer, provided on the first surface of the supporting body; a first transparent antenna, comprising an antenna body and a partition region, wherein a side of the first polymer layer away from the supporting body is provided with a concave structure, and the concave structure is provided with conductive material to form the first transparent antenna; a second polymer layer, provided on the second surface of the supporting body; a second transparent antenna, comprising an antenna body, wherein the antenna body of the second transparent antenna covers at least a part of the partition region of the first transparent antenna, a side of the second polymer layer away from the supporting body is provided with a concave structure, and the concave structure is provided with conductive material to form the second transparent antenna; and an adhesive layer, located between the first polymer layer and the second polymer layer; wherein a grid linewidth at an overlapping region is less than a grid linewidth at a non-overlapping region between the first transparent antenna and the second transparent antenna.

15. The transparent antenna of claim 14, wherein a projection of the second transparent antenna covers at least 60% of an area of the partition region of the first transparent antenna.

* * * * *